US006426641B1

(12) United States Patent
Koch et al.

(10) Patent No.: US 6,426,641 B1
(45) Date of Patent: Jul. 30, 2002

(54) SINGLE PIN PERFORMANCE SCREEN RING OSCILLATOR WITH FREQUENCY DIVISION

(75) Inventors: Steven P. Koch, Underhill; Donald L. Wheater, Hinesburg; Larry Wissel, Williston, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/177,139

(22) Filed: Oct. 21, 1998

(51) Int. Cl.[7] .............................................. G01R 31/28
(52) U.S. Cl. ..................... 324/765; 324/158.1; 324/763
(58) Field of Search ................................. 324/765, 763, 324/158.1, 73.1; 331/75, 55, 66, 139; 377/70; 714/733, 734, 735; 368/118, 113

(56) References Cited

U.S. PATENT DOCUMENTS

| 4,587,480 A | * | 5/1986 | Zasio ............................ 331/57 |
| 4,603,306 A | * | 7/1986 | Kleinberg .................... 331/66 |
| 4,782,283 A | | 11/1988 | Zasio ........................... 324/73 |
| 4,782,309 A | * | 11/1988 | Benjaminson ............... 331/139 |
| 5,457,400 A | | 10/1995 | Ahmad et al. ............... 324/763 |
| 5,619,463 A | * | 4/1997 | Malhi .......................... 365/201 |
| 5,621,361 A | | 4/1997 | Adduci ......................... 331/75 |
| 5,729,151 A | * | 3/1998 | Zoerner et al. ............. 324/765 |
| 5,818,250 A | * | 10/1998 | Yeung et al. ................ 324/763 |
| 6,084,482 A | * | 7/2000 | Nakamura .................... 331/44 |
| 6,134,191 A | * | 10/2000 | Alfke .......................... 368/118 |

OTHER PUBLICATIONS

Santos,"A One Pin Crystal Oscillator for VLSI Circuit", Apr. 1984, IEEE Journal of Solid State Circuits, vol. sc–19,No. 2, pp. 228–236.*

* cited by examiner

*Primary Examiner*—Vinh P. Nguyen
(74) *Attorney, Agent, or Firm*—Mark F. Chadurjian; Eugene I. Shkurko

(57) ABSTRACT

An oscillator circuit on a chip with a single I/O node whose output generally corresponds to a performance level of the IC chip. The single I/O node provides an easy access and testing point for evaluating chip performance. The I/O node is used for coupling to the oscillator circuit, and for activating and monitoring its oscillating output signal. The single I/O node may be accessed at the wafer level, after packaging, or in the field.

6 Claims, 5 Drawing Sheets

SINGLE PIN PERFORMANCE SCREEN RING OSCILLATOR WITH FREQUENCY DIVISION

BACKGROUND OF THE INVENTION

1. Technical Field of the Invention

This invention pertains to integrated circuit ("IC") chips and an apparatus and method for evaluating their performance. In particular, this invention provides a ring oscillator circuit built into an IC chip. The circuit includes a single input/output ("I/O") used for activating and monitoring the circuit in order to evaluate a performance level of the IC chip.

2. Background Art

Related prior art circuit designs require two pins for activation and monitoring.

SUMMARY OF THE INVENTION

This invention pertains to an apparatus and method for evaluating performance of an IC. An advantage of the present invention includes determining whether manufacturing or process variations have caused performance of an IC to deviate out of spec. The invention provides a single I/O oscillator circuit on a chip whose output generally corresponds to a performance level of the IC chip, thereby providing an easy access and testing method for evaluating chip performance. The I/O point is used for coupling to the circuit, activating the circuit, and monitoring its oscillating output signal. The single I/O point may be accessed at the wafer level, after packaging (via an I/O pin on a module, for example), in the field, or at any point between manufacture and end use.

It is an object of the invention to screen IC products based on performance by providing a screening apparatus activated and monitored with a single pin, immune to harmonic generation, and whose oscillation is not a function of the load.

Other features and advantages of this invention will become apparent from the following detailed description of the presently preferred embodiment of the invention, taken in conjunction with the accompanying drawings.

BEST MODE FOR CARRYING OUT THE INVENTION

Figure 1:
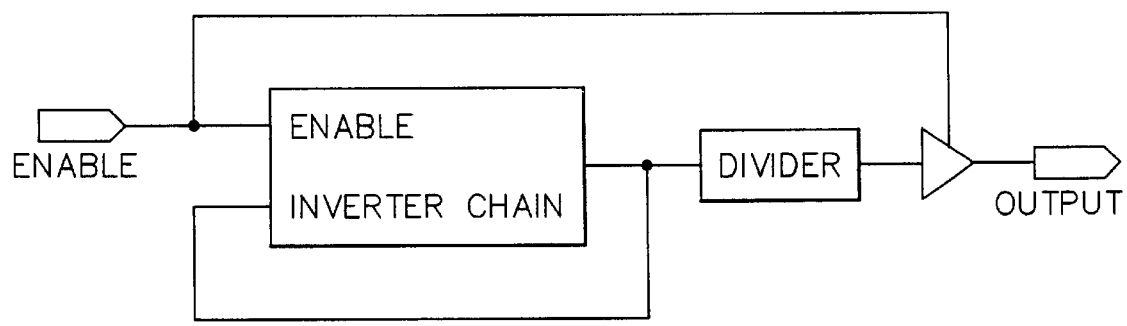
FIGS. 1 and 2 illustrate prior art oscillator circuits.
Figure 2:
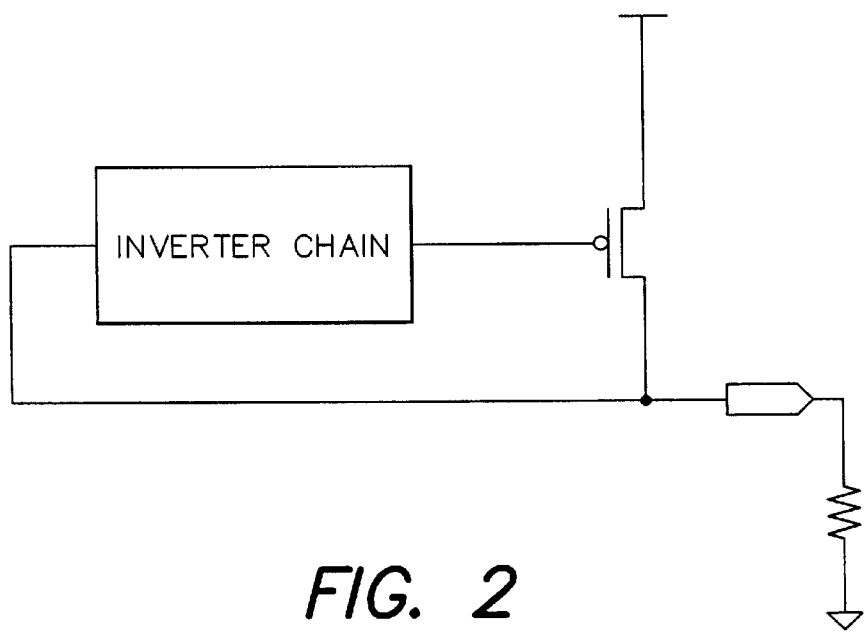

Referring to FIG. 1, shown is a 2-pin, small stage-count oscillator with a divider. This small stage-count design avoids harmonics problems in the oscillator, however, the small stage-count results in an increased output frequency which may be difficult to use for monitoring purposes. Thus, the divider is introduced to reduce the output frequency. Referring to FIG. 2, shown is a 1 pin, high stage-count oscillator without a divider. Hence, the inverter chain includes a large number of inverters to reduce the output frequency. The high number of inverters, however, may result in undesirable harmonics in the loop. Moreover, the output pad is in the critical path allowing loading of the output stage to influence the oscillator frequency. Thus, the present invention can be understood to provide the advantages of an oscillator having one pin for activation and measurement, no harmonics because of the small number of stages in the delay block, and low frequency, provided by the addition of a divider, which is not a function of the load because the delay path does not include the load.

Figure 3:
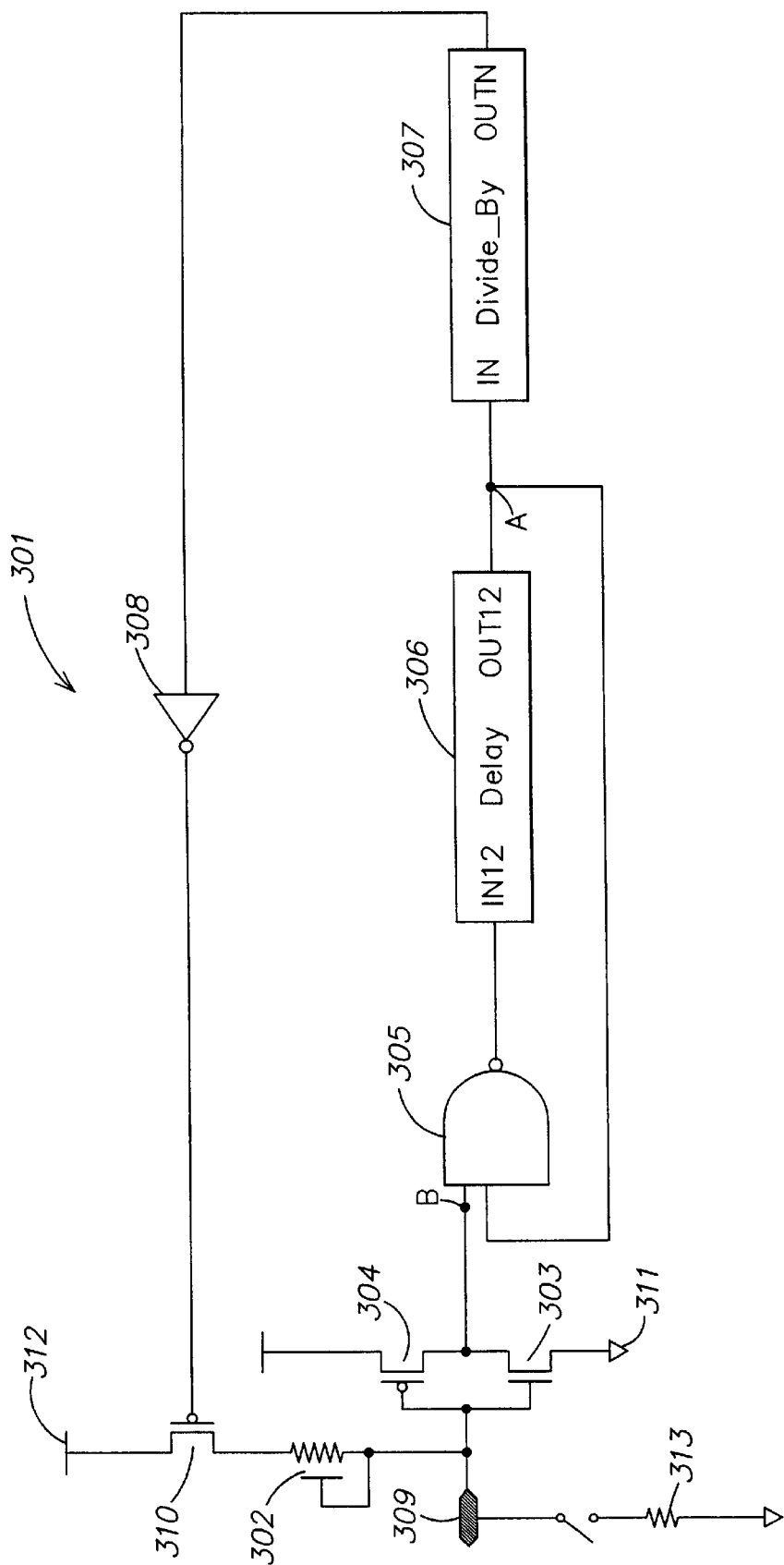
FIG. 3 illustrates the present invention oscillator circuit.
Figure 6:
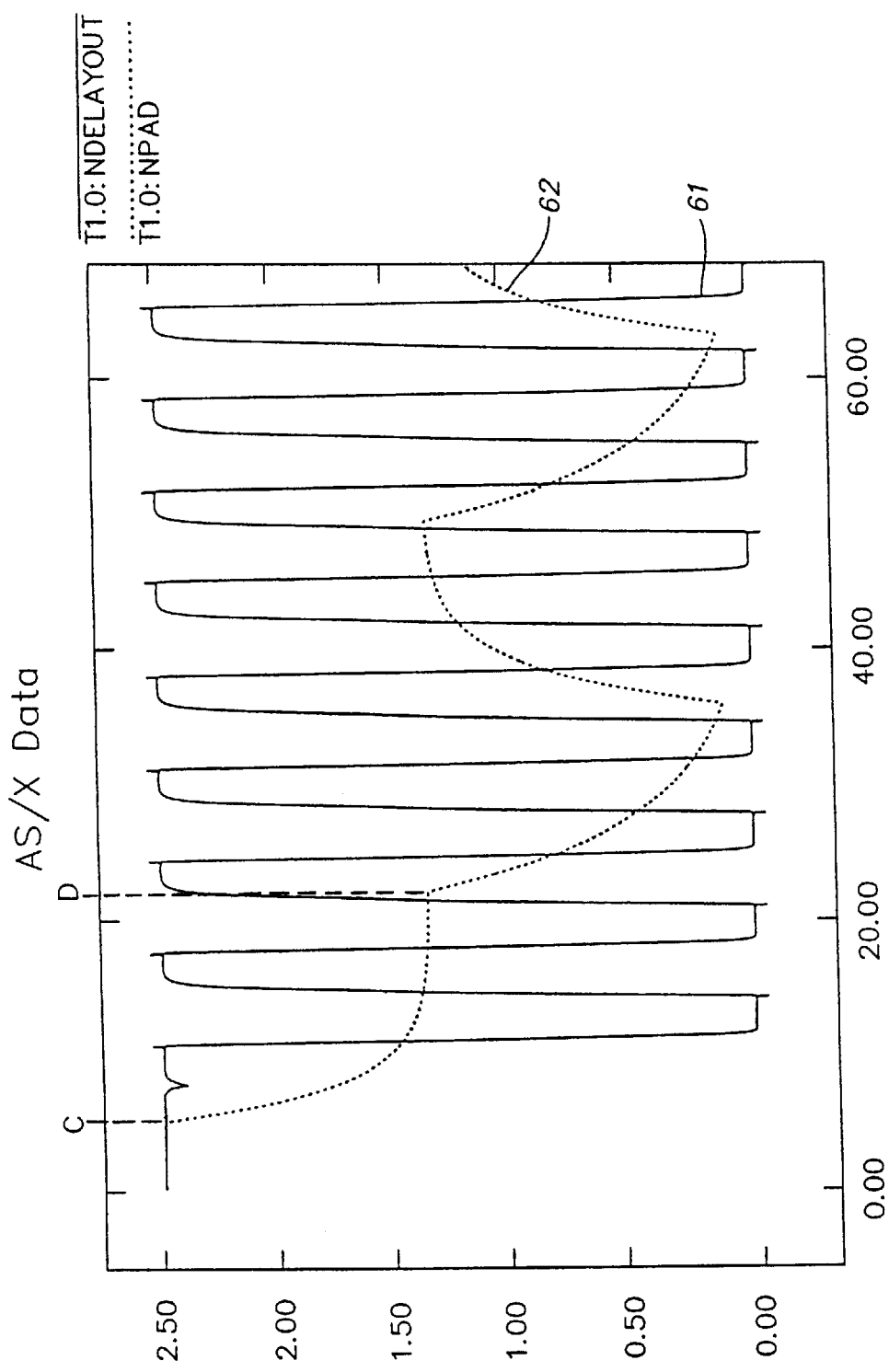
FIG. 6 illustrates waveforms from the invention oscillator delay stage and from its output pad.

In reference to FIG. 3, which illustrates the circuit of the present invention, a single I/O oscillator circuit is provided on-chip whose output frequency generally corresponds to a performance level of the IC chip, thereby providing an easy access and testing method for evaluating chip performance. The I/O point 309 is used for coupling to the circuit, for activating the circuit, and for monitoring its oscillating output signal. In operation, uncontacted pad 309 is kept high by the power supply 312 of oscillator circuit 301 which, in turn, inhibits oscillation at pad 309. The activating signal applied to pad 309 involves contacting pad 309 via a grounded pull-down resistor 313. When the voltage at pad 309 is pulled low enough the oscillator circuit begins oscillating. Point C in FIG. 6 shows the voltage at pad 309 at the point when probe contact is made with pad 309. The voltage at pad 309 begins to drop upon probe contact until point D whereafter an oscillation frequency 62 can be detected at pad 309.

In greater detail, this operation occurs as follows: a grounded resistor 313 is coupled to pad 309 having sufficient resistance such that a voltage division between resistor 313 and internal resistances 310 and 302 brings the voltage on pad 309 low, i.e. about ½ $V_{dd}$ or closer to ground than to the power supply voltage $V_{dd}$. Example resistances might be about 60 ohms or more for device 310 and resistance 302 combined, and tens of ohms of resistance in resistor 313 of the probe, all values being dependent on power supply voltages and desired amplitudes at the output pad. Resistance 302 insures that its resistance combined with device 310 provides a sufficient voltage divider network so as not to apply too high a voltage signal to pad 309 and thereby disable the oscillator. However, the circuit can be made fully operational without resistance 302 by appropriately decreasing the size of transistor 310 to compensate for the absence of resistance 302. When pad 309 goes low, PFET 304 turns on and the node B voltage rises. In turn NAND gate 305 turns on and the entire ring oscillator (combination of NAND gate 305 and Delay block 306) is turned on. Delay stage 306 comprises an even number of delay stages which, in turn, passes through divide-by circuit 307 and inverter 308. The frequency of oscillation is divided by divider circuit 307. The inverter drives PFET 310 which, in turn, causes pad 309 to oscillate between ground and approximately ½ $V_{dd}$ by modulating current flow therethrough. Once enabled, the period of oscillation is independent of voltage swings at pad 309. The amplitude of this signal applied to the pad 309 remains low enough such that the threshold of the inverter formed by devices 303 and 304 is not reached, i.e. the inverter continues to see a logical zero at its input (pad 309). This is implemented by selecting a size of the PFET 304 to dominate the NFET 303. If the present circuit is implemented in 2.5V technology (power supply), the design of the inverter could readily ignore signals of 1.2 V appearing at its input (and across the external resistor 313). Delay stage 306 may include inverting stages or buffers.

In reference to FIG. 6, element 61 indicates an internal operating frequency of the oscillator circuit at node A of FIG. 3. The present invention is directed towards determining this operating frequency, which is normally unknown, by coupling a test circuit to the pad 309 of FIG. 3, obtaining an output 62 therefrom, and extrapolating the characteristics of the frequency waveform 61, based on known parameters of the oscillator circuit, such as the known divide-by ratio of frequency divider 307.

Typically, an acceptable IC performance window includes a frequency range within which the detected frequency must fall. Based upon the acceptable performance window, the known divide-by ratio, and the number of delay stages in delay circuit 306, the performance of the IC chip having the presently described detection circuit can be easily determined.

Alternative Embodiments

Figure 4:
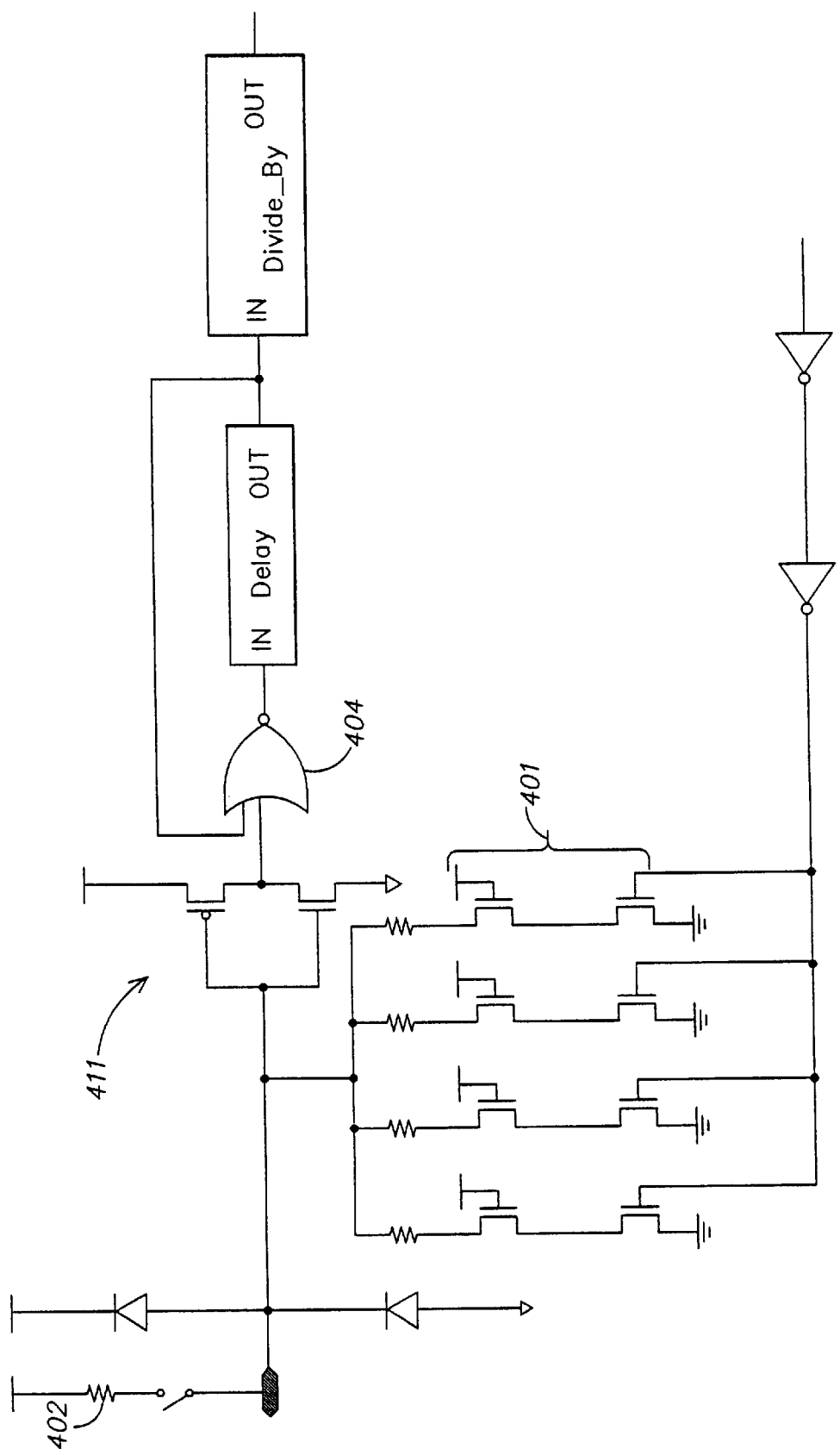
FIGS. 4 and 5 illustrate alternative embodiments of the invention oscillator circuit.
Figure 5:
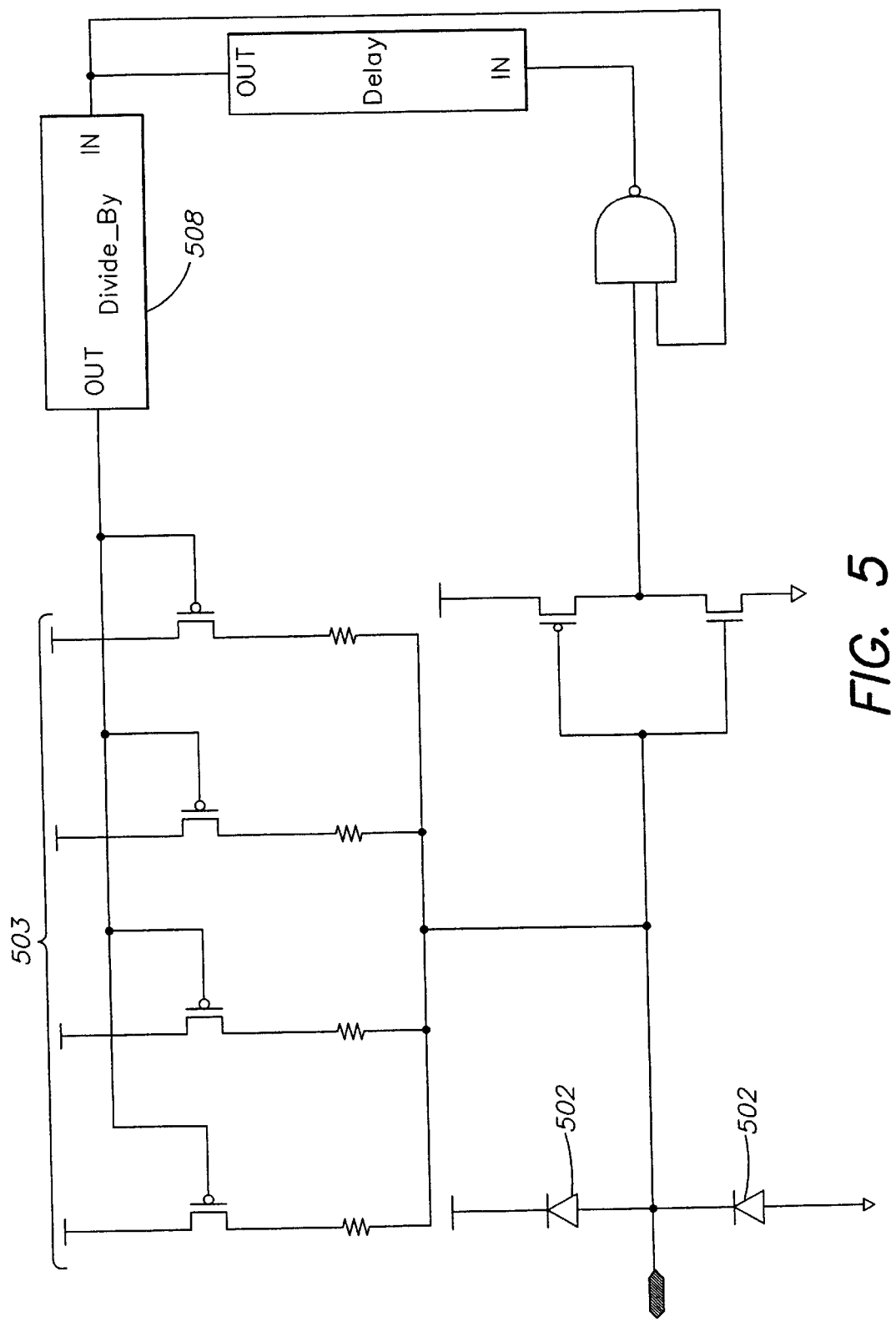

Referring to FIGS. 4 and 5, shown are a pull-down activation scheme and a pull-up activation scheme. FIG. 5 shows a divider 508 incorporating the inverter 308 shown in FIG. 3, and a group of PFETS and resistors 503 that are simplified to one PFET and one resistor in FIG. 3. Diodes 502 are added at the pad for improved ESD protection of the inverter. Referring to FIG. 4, the PFETS of FIG. 5 are replaced with NFETS 401, a pull-up at the pad (resistor 402 between the pad and Vdd) is used for activation of the oscillator, and the NAND gate is replaced with a NOR gate 404. In this embodiment, the uncontacted pad is kept at a low voltage by the NFETS 401 coupled to ground. Inverter 411, in this embodiment, is NFET dominant.

The matter contained in the above description or shown in the accompanying drawings have been described for purposes of illustration and shall not be interpreted in a limiting sense. It will be appreciated that various modifications may be made in the above structure and method without departing from the scope of the invention described herein. Thus, changes and alternatives will now become apparent to those skilled in the art without departing from the spirit and scope of the invention as set forth in the following claims. Accordingly, the scope of protection of this invention is limited only by the following claims and their equivalents.

What is claimed is:

1. Apparatus comprising:
   an IC chip;
   a pad on IC chip;
   an oscillator circuit manufactured on the IC chip, the oscillator circuit comprising:
      an oscillator having a first input and a first output;
      only one I/O point connected to the pad for receiving an activation signal which starts the oscillator, and for outputting an oscillating signal having a frequency generated by the started oscillator; and
      a first inverter having a second input coupled to the I/O point and a second output coupled to the first input of the oscillator, and a buffer having a third input coupled to the first output of the oscillator and a third output coupled to the I/O point, wherein the first inverter and the buffer isolate the oscillator from the I/O point after the oscillator is started to maintain the frequency of the oscillating signal independent of loading on the I/O point,
   further wherein the frequency of the oscillating signal is monitored in order to determine whether the frequency falls within a predetermined performance window.

2. The apparatus of claim 1, wherein the buffer comprises a second inverter and an FET.

3. The apparatus of claim 1, wherein the first inverter comprises a PFET and an NFET.

4. The apparatus of claim 3, wherein a size of the PFET is selected to dominate the NFET.

5. An IC chip testing system comprising:
   an IC chip;
   a contact pad on the IC chip;
   an oscillator circuit manufactured on the IC chip, the oscillator circuit comprising:
      an oscillator having an input and an output;
      only one I/O node connected to the contact pad for receiving an activation signal which starts the oscillator, and for outputting an oscillating signal having a frequency generated by the started oscillator; and
      a first inverter coupled to the one I/O node and the input of the oscillator, and a buffer coupled to the output of the oscillator and the one I/O node, wherein the first inverter and the buffer isolate the oscillator from loading effects induced upon the one I/O node after the one I/O node receives the activation signal so that the frequency of the oscillating signal is thereafter independent of loading on the one I/O point.

6. A method of testing an IC chip, comprising:
   manufacturing an oscillator circuit on the IC chip, wherein the oscillator circuit comprises an oscillator having an input and an output, only one I/O point, a first inverter and a buffer;
   providing a contact pad on the IC chip that is connected to the only one I/O point;
   coupling a probe to the pad, including inducing an activation voltage on the pad with the probe for starting the oscillator circuit oscillating and maintaining contact between the probe and the pad;
   the probe receiving an oscillating signal having a frequency from the started oscillator circuit through the pad via the only one I/O point;
   the first inverter coupled to the one I/O point and the input of the oscillator, and the buffer coupled to the output of the oscillator and the one I/O point, wherein the first inverter and the buffer isolate the oscillator from the one I/O point after the oscillator is started for maintaining the frequency of the oscillating signal independent of loading on the one I/O point, and
   measuring the frequency of the oscillating signal.

* * * * *